(12) United States Patent
Tsai et al.

(10) Patent No.: US 6,822,910 B2
(45) Date of Patent: Nov. 23, 2004

(54) NON-VOLATILE MEMORY AND OPERATING METHOD THEREOF

(75) Inventors: Wen-Jer Tsai, Hualian (TW); Chih-Chieh Yeh, Taipei (TW); Tao-Cheng Lu, Kaoshiung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/248,220

(22) Filed: Dec. 29, 2002

(65) Prior Publication Data

US 2004/0125655 A1 Jul. 1, 2004

(51) Int. Cl.[7] .............................................. G11C 16/04
(52) U.S. Cl. .............................. 365/185.29; 365/185.18
(58) Field of Search ..................... 365/185.29, 185.18

(56) References Cited

U.S. PATENT DOCUMENTS

| | | | | |
|---|---|---|---|---|
| 5,748,538 A | * | 5/1998 | Lee et al. | 365/185.06 |
| 6,181,607 B1 | * | 1/2001 | Lee et al. | 365/185.29 |
| 6,317,362 B1 | * | 11/2001 | Nomura et al. | 365/185.2 |
| 2003/0151948 A1 | * | 8/2003 | Bhattacharyya | 365/185.18 |

* cited by examiner

Primary Examiner—Huan Hoang
(74) Attorney, Agent, or Firm—Jianq Chyun IP Office

(57) ABSTRACT

A non-volatile memory device is described, comprising a plurality of memory cells, a plurality of word lines, a plurality of drain lines, and a plurality of source lines, wherein two adjacent memory cells in a column constitute a cell pair, and all cell pairs are arranged in rows and columns. The two memory cells in each cell pair share a source region, and two adjacent cell pairs in a column share a drain region. The source regions and the gates of the memory cells in the same row are coupled to a source line and a word line, respectively, and the drain regions of the memory cells in the same column are coupled to a drain line.

16 Claims, 4 Drawing Sheets

US 6,822,910 B2

NON-VOLATILE MEMORY AND OPERATING METHOD THEREOF

BACKGROUND OF INVENTION

1. Field of Invention

The present invention relates to a structure of a non-volatile memory and an operating method thereof. More particularly, the present invention relates to a structure of a non-volatile memory that stores one bit per cell (1 bit/cell) and an operating method thereof.

2. Description of Related Art

In the family of non-volatile memory devices, various electrically erasable programmable read-only memory ($E^2$PROM) devices have been widely used in personal computers and electronic apparatuses since they can be programmed, erased and read repeatedly, and can retain data even if disconnected from electrical power. A conventional $E^2$PROM adopts a floating gate and a control gate both made from doped polysilicon. After the $E^2$PROM is programmed by charge injection, the charges distribute evenly in the floating gate. Therefore, a leakage easily occurs in a memory cell if there are defects in its tunnel oxide layer under the floating gate, and the reliability of the device is lowered.

To solve the leakage problem of the conventional $E^2$PROM, a charge-trapping layer is recently developed to replace the polysilicon floating gate used in the conventional flash memory. The charge-trapping layer usually comprises a silicon nitride layer that is disposed between two silicon oxide layers to form an oxide/nitride/oxide (ONO) composite structure, while the memory with such a charge-trapping layer is known as a "nitride read-only memory (NROM)".

An NROM can be programmed with channel hot electron injection (CHEI) mechanism, wherein appropriate biases are applied to the gate and the source/drain of the NROM cell. If the bias on the drain is higher than that on the source, hot electrons are generated in the channel near the drain and injected into the nitride charge-trapping layer. Since the nitride charge-trapping layer is able to trap electrons, the injected electrons will not distribute evenly in the charge-trapping layer, but will be localized in a region of the charge-trapping layer near the drain. Because the injected electrons are localized, the charge-trapping region is small and is less likely to locate on the defects of the tunnel oxide layer. A leakage therefore does not easily occur in the device.

FIG. 1 illustrates a local circuit diagram of a conventional NROM array, which is also disclosed in U.S. Pat. No. 5,966,603. The memory array illustrated in FIG. 1 is a 3×3 array that includes memory cells Qn1~Qn9 coupled to word lines WL01~WL03, bit lines BL1 and BL2, and source lines SL1 and SL2. The drains of Qn1, Qn4 and Qn7 are coupled to BL1, and the drains of Qn2, Qn3, Qn5, Qn6, Qn8 and Qn9 are coupled to BL2. The sources of Qn1, Qn2, Qn4, Qn5, Qn7 and Qn8 are coupled to SL1, and the sources of Qn3, Qn6 and Qn9 are coupled to SL2. The gates of the memory cells in the same row are connected to a word line, i.e., the gates of Qn1~Qn3 are coupled to WL01, the gates of Qn4~Qn6 to WL02, and the gates of Qn7~Qn9 to WL03.

Referring to FIG. 1, in each row of memory cells, the gates of the cells are coupled to the same word line, each cell shares its source and drain with two adjacent cells, and the sources or drains of the cells are coupled to different source lines or bit lines. Since a memory cell shares a word line and its source/drain with other cells, it is necessary to apply different biases to different source lines or bit lines as a specific memory cell is to be programmed, and the programming process therefore is quite complicated.

For example, when the source side of Qn5 is being programmed, WL02, SL1 and BL2 are applied with 5V, 5V and 0V, respectively, to induce band-to-band hot hole phenomenon and thereby inject hot holes into the charge trapping layer on the source side. However, at the same time, the bit line BL1 coupled to Qn4 must be applied with 3V to prevent programming of Qn4 since Qn4 and Qn5 both are coupled to the same word line WL02 and the same source line SL1. Similarly, when the drain side of Qn5 is being programmed, WL02, BL2 and SL1 are applied with 5V, 5V and 0V, respectively, to induce band-to-band hot hole phenomenon and thereby inject hot holes into the charge trapping layer on the drain side. However, at the same time, the source line SL2 coupled to Qn6 must be applied with 3V to prevent programming of Qn6 since Qn6 and Qn5 both are coupled to the same word line WL02 and the same bit line BL2. Accordingly, the programming process is quite complicated.

On the other hand, since the conventional NROM array uses buried source lines and buried bit lines that have high resistance, the operating speed of the memory device is not easy to raise.

SUMMARY OF INVENTION

Accordingly, this invention provides a non-volatile memory and the operating method thereof, wherein the programming operation of a single memory cell does not interfere with other memory cells.

This invention also aims to provide a non-volatile memory and the operating method thereof that allow a programming operation with one bit, one byte or one sector as a unit.

This invention further provides a non-volatile memory and the operating method thereof to increase the operation speed of the memory device.

The non-volatile memory device of this invention comprises a plurality of memory cells, a plurality of word lines, a plurality of drain lines and a plurality of source lines, wherein two adjacent memory cells in a column constitute a cell pair, and all cell pairs are arranged in rows and columns. The two memory cells in each cell pair share a source region, and two adjacent cell pairs in a column share a drain region. The source regions and the gates of the memory cells in the same row are coupled to a source line and a word line, respectively, and the drain regions of the memory cells in the same column are coupled to a drain line.

Accordingly, the source lines are parallel to the word lines and perpendicular to the drain lines in the non-volatile memory of this invention. Therefore, a low power operation frequently used in localized charge storage memory devices is particularly suitable for the non-volatile memory. That is, the non-volatile memory device can be erased with Fowler-Nordheim (FN) tunneling mechanism, programmed with band-to-band hot hole injection mechanism on the source side, and read from the opposite drain side.

Moreover, the sources of the memory cells in the same column are coupled to different source lines, so the programming operation of a single memory cell does not interfere with other memory cells.

In the non-volatile memory of this invention, the source line and the drain line can comprise a low-resistance material such as metal. Since the sources/drains of the memory cells in the same rows/columns are electrically connected to a source/drain line, the resistance of the memory array is lower and the operating speed is higher as compared with a conventional memory array using buried bit lines and buried source lines.

Moreover, since the non-volatile memory of this memory does not use buried bit lines, the sources/drains can be formed after the word lines are formed and the manufacturing process thus is more compatible with conventional CMOS process.

Furthermore, in this invention, an isolation can be formed between columns of memory cells, and spacers can be formed on the sidewalls of the gates of the memory cells. With the isolation and the spacers, the contacts between the sources/drains and source/drain lines can be formed as borderless contacts.

This invention also provides an operating method of the aforementioned non-volatile memory of this invention. In an erasing operation, the selected word line is applied with a first positive voltage, and the p-well of the selected cells (sector), the selected drain lines and the selected source lines are applied with 0V to erase the selected memory cells with channel FN tunneling mechanism. In a programming operation, the selected word line is applied with a first negative voltage, the selected source line with a second positive voltage, and the selected drain line with 0V to program the source side of the selected memory cell with band-to-band hot hole injection mechanism.

In the operating method of a non-volatile memory of this invention, another type of erasing operation can be adopted. The selected word line is applied with a negative voltage, and the p-well of the selected cells (sector), the selected drain lines and the selected source line are applied with a positive voltage. The difference between negative voltage and the positive voltage is large enough to induce FN tunneling effect and thereby inject electrons into the charge-trapping layer from the gate.

As mention above, the non-volatile memory device of this invention can be erased with the FN tunneling mechanism, and programmed with band-to-band hot hole injection mechanism. In the erasing operation using the FN tunneling mechanism, the memory cells can be erased with one row, one sector, or one block as a unit by controlling the word lines. In the programming operation using the band-to-band hot hole injection mechanism, it is possible to program a single memory cell without interfering with other memory cells.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
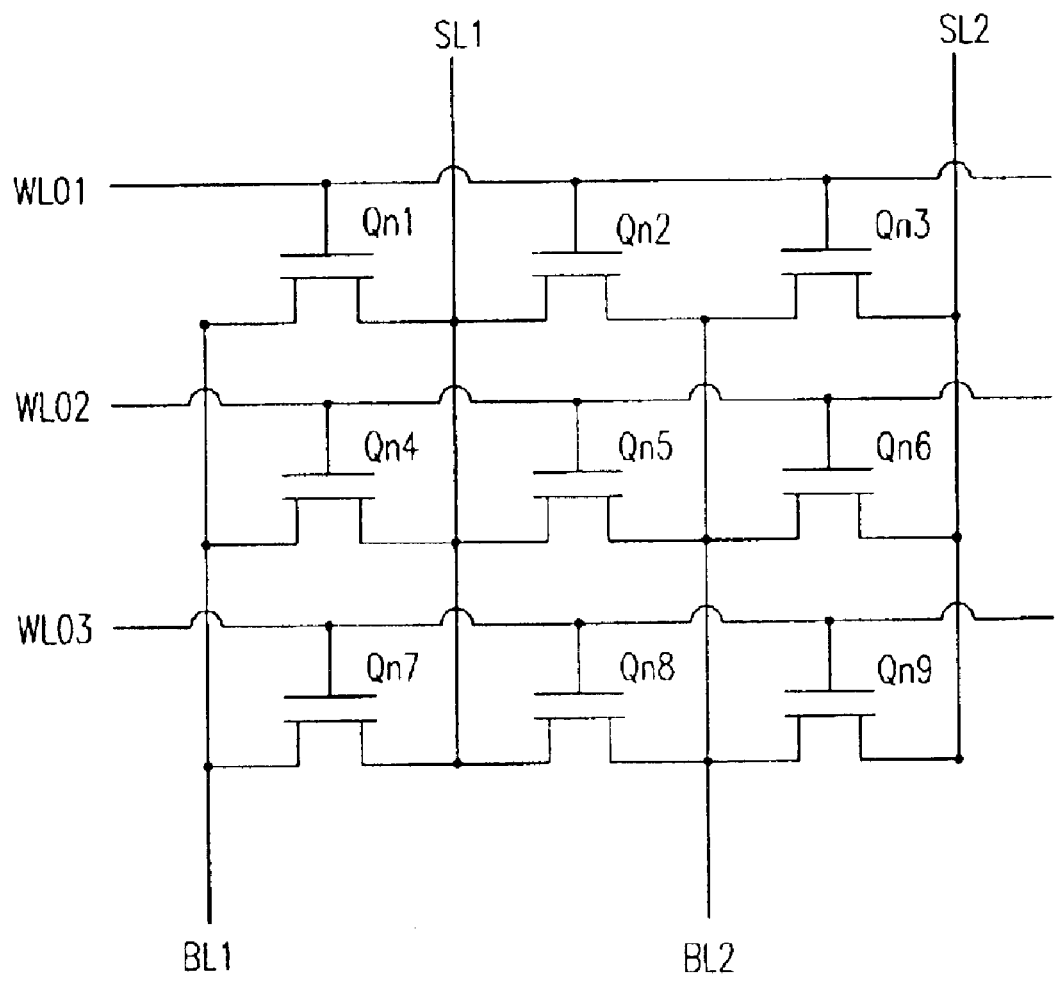
FIG. 1 illustrates a local circuit diagram of a non-volatile memory array in the prior art.
Figure 2:
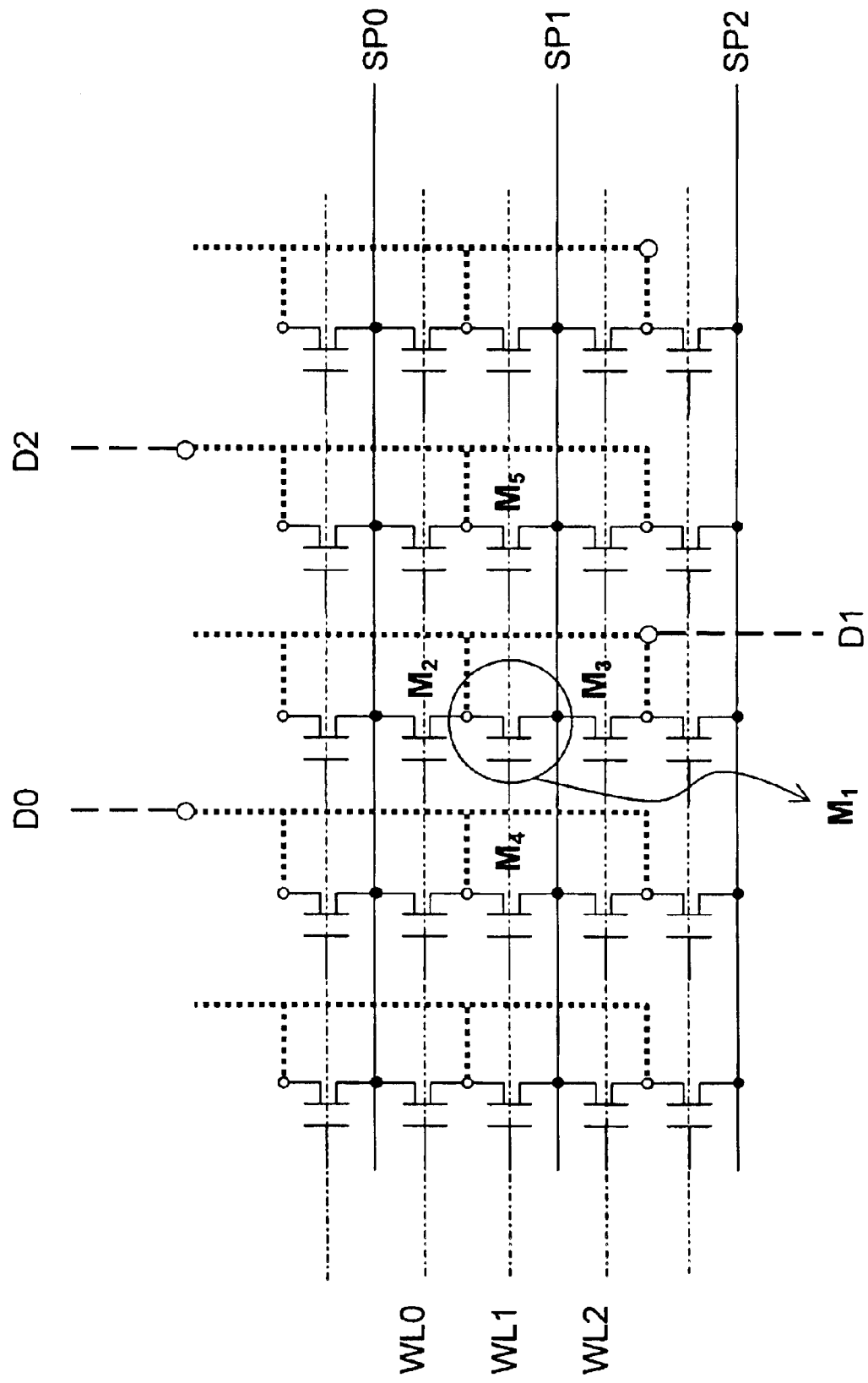
FIG. 2 illustrates a local circuit diagram of a non-volatile memory array according to a preferred embodiment of this invention.

FIG. 2 illustrates a local circuit diagram of a non-volatile memory array according to the preferred embodiment of this invention, wherein a plurality of memory cells including M1~M5, a plurality of word lines including WL0~WL2, a plurality of source lines SP0~SP2, and a plurality of drain lines including D0~D2 are depicted. The configuration of the five memory cells M1~M5 and the behaviors thereof are taken as an example in the preferred embodiment.

For example, among the three memory cells M1~M3 in the same column, M1 and M3 share a source and can be grouped as a cell pair, while M1 and M2 share a drain. That is, the two memory cells in one cell pair share a source, and the two adjacent memory cells in two adjacent cell pairs in the same column share a drain. Moreover, the drains of the three memory cells M1~M3 in the same column are all coupled to the drain line D1. Similarly, the drain of M4 is coupled to D0 together with those of the other memory cells in the same column, and the drain of M5 is coupled to D2 together with those of the other memory cells in the same column.

Referring to FIG. 2 again, the gates of the three memory cells M4, M1 and M5 in the same row are coupled to the same word line WL1. Similarly, the gate of M2 is coupled to WL0 together with those of the other memory cells in the same row, and the gate of M3 is coupled to WL2 together with those of the other memory cells in the same row. In addition, the sources of the three memory cells M4, M1 and M5 in the same row are all coupled to the same source line SP1. Similarly, the source of M2 is coupled to SP0 together with those of the other memory cells in the same row, and the source of M3 is coupled to SP1 together with those of the other memory cells in the same row.

Figure 3:
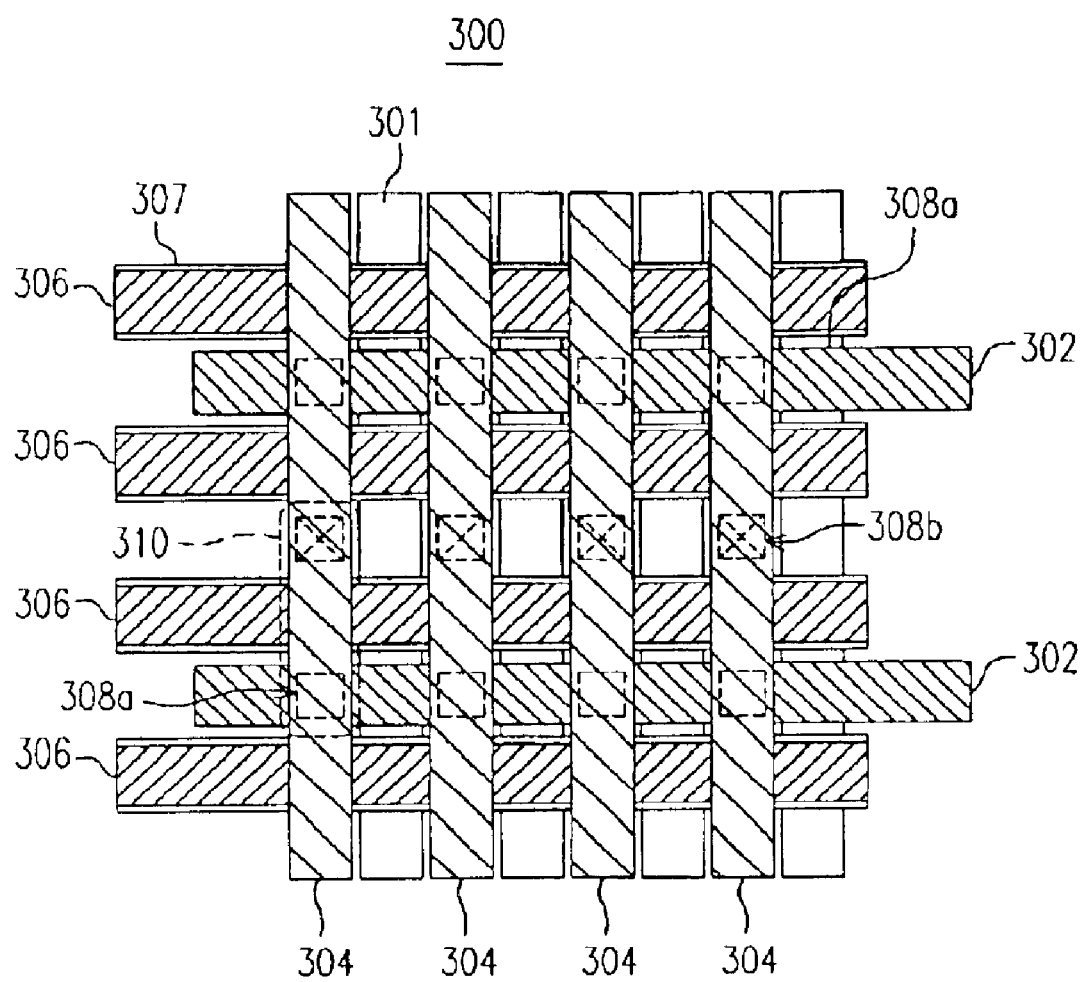
FIG. 3 schematically illustrates a layout of a non-volatile memory array according to the preferred embodiment of this invention.

FIG. 3 schematically illustrates a layout of a non-volatile memory array according to the preferred embodiment of this invention. Referring to FIG. 3, the non-volatile memory array 300 is constituted of a plurality of isolation structures 301, a plurality of memory cells 310, a plurality of word lines 306, a plurality of spacers 307, a plurality of drain lines 304 and a plurality of source lines 302. The word lines 306 perpendicularly cross over the isolation structures 301 to define the memory cells 310, and the spacers 307 are formed on the sidewalls of the word lines 306. The source lines 302 are connected with the source regions (the regions under 308a) of the memory cells 310 via contacts 308a, and the drain lines 304 are connected with the drain regions (the regions under 308b) of the memory cells 310 via contacts 308b. The drain lines 304 and the source lines 302 preferably comprise metal to reduce the resistance of the memory array, so that the memory device has a higher operating speed as compared with the conventional ones using buried bit lines.

Moreover, since the non-volatile memory of this invention does not use buried bit lines, the sources/drains can be formed after the word lines are formed, and the manufacturing process thus is more compatible with conventional CMOS processes.

Furthermore, in this invention, an isolation can be formed between columns of memory cells, and spacers can be formed on the sidewalls of the gates of the memory cells.

With the isolation and the spacers, the contacts between the sources/drains and source/drain lines can be formed as borderless contacts.

Figure 4A:
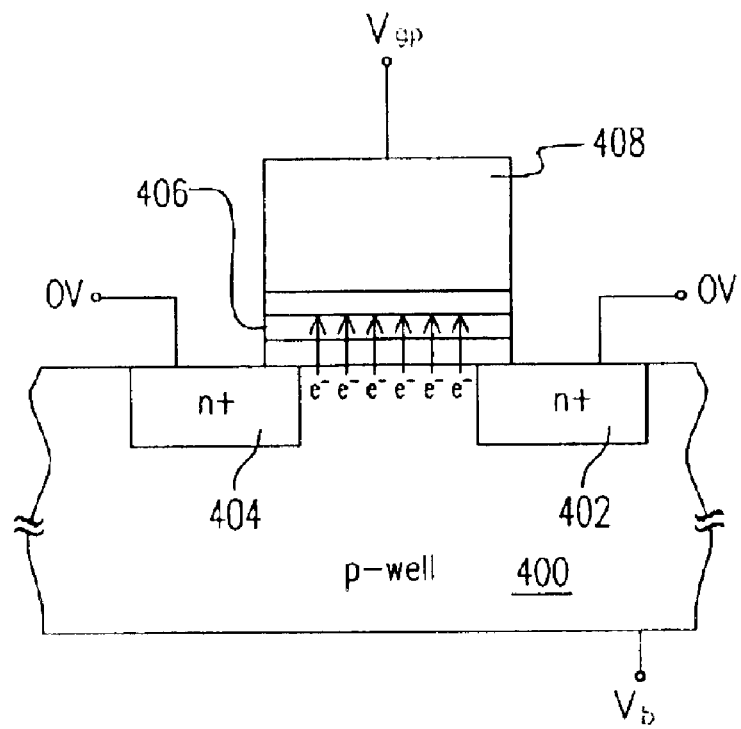
FIG. 4A schematically illustrates an erasing operation of a non-volatile memory cell according to the preferred embodiment of this invention.
Figure 4B:
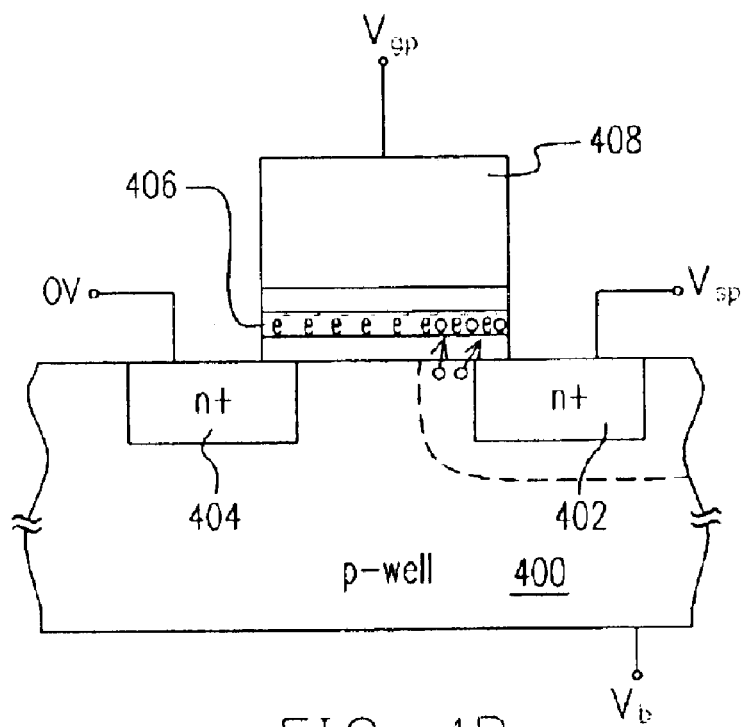
FIG. 4B schematically illustrates a programming operation of a non-volatile memory cell according to the preferred embodiment of this invention.

Refer to Table 1 and FIGS. 2, 4A and 4B to understand an operating method of the non-volatile memory device of this invention, including an erasing operation (FIG. 4A), a programming operation (FIG. 4B) and a reading operation, wherein the memory cell M1 is taken as an example. The non-volatile memory device illustrated comprises a p-well 400, a gate 408 on the p-well 400, an ONO charge-trapping layer 406 between the p-well 400 and the gate 408, and an n$^+$-source 402 and an n$^+$-drain 404 in the p-well 400 beside the gate 408. The erasing operation is done by using the FN tunneling mechanism, and the programming operation by using band-to-band hot hole injection.

TABLE 1

| | | Program (V) | Read (V) | | Erase (V) | | |
|---|---|---|---|---|---|---|---|
| Word line | WL0 | 0 | 0 | 18 | 10 | −18 | −10 |
| | WL1 | −5 | 3 | | | | |
| | WL2 | 0 | 0 | | | | |
| Source line | SP0 | 0 | 0 | 0 | −8 | 0 | 8/floating |
| | SP1 | 5 | 0 | | | | |
| | SP2 | 0 | 0 | | | | |
| Drain line | Selected (D1) | 0 | 1.5 | 0 | −8 | 0 | 8/floating |
| | Unselected (D0 · D2) | 3 | | | | | |
| | p-well(V$_b$) | 0 | 0 | 0 | −8 | 0 | 8 |

As shown in Table 1 and FIGS. 2, 4A and 4B, when M1 is being erased, the gate 408 is applied with a positive voltage Vge of about 18V from the selected word line WL1, the p-well 400 is applied with 0V, and the drain 404 and the source 402 are applied with 0V from drain line D1 and source line SP1, respectively. With the bias configuration, a large electrical field is established between the gate 408 and the p-well 400 to cause channel FN tunneling effect, whereby electrons are injected into the charge-trapping layer 406, as shown in FIG. 4A. Since the charge-trapping layer 406 carries net negative charges after the erasing operation, the threshold voltage (V$_T$) of the memory cell is raised to high level. Moreover, with the voltage difference between the gate and the source/drain being set as 18V, it is also feasible to apply a positive voltage Vge of 10V to WL1, and apply a negative voltage of about −8V to D1, SP1 and the p-well 400, as shown in Table 1.

Besides, in another erasing operation of the non-volatile memory of this invention, the voltage polarity between the word line and the source/drain line is reversed, and electrons are injected into the charge-trapping layer 406 from the gate 408, instead of the p-well 400 and the source/drain 402/404. As shown in Table 1, a negative voltage Vge of −18V or −10V is applied to WL1, while 0V or 8V is applied to the p-well 400. D1, SP1 may be left floating, or be applied with the same voltage applied to the p-well 400. With the bias configuration, a large electrical field is established between the gate 408 and the p-well 400, and electrons are injected to the charge-trapping layer 406 from the gate 408 with FN tunneling mechanism.

To program the memory cell M1 with band-to-band hot hole injection, the gate 408 is applied with a negative voltage Vgp, such as −5V, from the selected word line WL1, and the p-well 400 is applied with 0V. The source 402 is applied with a positive voltage Vsp of 5V from the source line SP1, and the drain 404 is applied with 0V from the drain line D1. With this bias configuration, deep depletion phenomenon is induced around the source 402 under the gate 408, wherein electron-hole pairs are generated and separated. The holes are accelerated by the high electric field perpendicular to the tunnel oxide to generate hot holes, which have sufficient energy to overcome the barrier height of the tunnel oxide to be injected into the charge-trapping layer 406 near the source 402, as shown in FIG. 4B. After the programming operation, the memory cell M1 has a local low-level threshold voltage near the source side because the negative charges originally in the charge-trapping layer 406 near the source 402 are neutralized by the injected holes.

To read the data stored in the source side 402 of M1, the drain 404 is applied with a voltage of about 1.5V from the drain line D1, the gate 408 is applied with a positive voltage of about 3V from the word line WL1, and the source 402 is applied with 0V from the source line SP1. The p-well 400 is applied with 0V. If the electrons in the charge-trapping layer 406 near the source 402 are not neutralized, the channel cannot be switched on and the channel current is extremely small. On the contrary, if the electrons in the charge-trapping layer 406 near the source 402 have been neutralized, the channel can be switched on and the channel current is large. Thus, the data (0/1) stored on the source side of the memory cell can be identified.

Refer to FIG. 2 to understand an operating method of the non-volatile memory array of this invention, wherein the erasing operation of M1 is taken as an example, and the behaviors of the adjacent memory cells M2~M5 are described together. When M1 is being erased, the selected word line WL1 is applied with a positive bias Vge, such as 18V, the unselected word lines WL0 and WL2 are applied with 0V, the p-well is applied with 0V, and D1 and SP1 are applied with 0V. Thus, a FN tunneling phenomenon is induced, and electrons are injected into the charge-trapping layer 406 to render M1 in an erased state having a high-level threshold voltage.

During the above erasing operation, the memory cells can be erased with one row as a unit, and the drain side and the source side of each memory cell are erased simultaneously. That is, the memory cells M4, M1 and M5 that coupled to the same word line WL1 are erased simultaneously. On the other hand, the memory cells M2 and M3 coupled to WL0 and WL2 are not erased since the unselected word lines WL0 and WL2 are all biased with 0V.

Next, the programming operation of M1 is taken as an example. When M1 is being programmed, the selected word line WL1 is applied with a negative voltage Vgp, such as −5V, and the unselected word lines WL0 and WL2 are applied with 0V. The p-well is applied with 0V. The selected drain line SP1 is applied with a positive voltage Vdp, such as 5V, the selected drain line D1 with 0V, and the unselected drain lines D0 and D2 with a positive voltage, such as 3V. Consequently, band-to-band hot holes are generated and injected into the charge-trapping layer 406 from source side, and the memory cell M1 is in a written state with a low-level threshold voltage (V$_T$).

During the above programming operation, the memory cells M2 and M3 are not programmed because the unselected word lines WL0 and WL2 are all biased with 0V and band-to-band hot holes necessary for programming cannot be generated in M2 and M3. Meanwhile, M4 and M5 are not programmed since the unselected drain lines D0 and D2 both are biased with 3V to suppress generation of band-to-band hot holes.

In the above method for operating a non-volatile memory of this invention, the programming operation is done by using band-to-band hot hole injection, and the erasing operation by using Fowler-Nordheim tunneling. The erasing operation using Fowler-Nordheim tunneling is capable of erasing a row, a sector or a block of memory cells at the same time by controlling the word lines. Meanwhile, it is possible to specifically program a single memory cell without interfering with other memory cells in the memory array.

Moreover, since the sources/drains of the memory cells in the same rows/columns are electrically connected to a source/drain line that comprises a low-resistance material like metal, the resistance of the memory array is lower. Therefore, the memory device has a higher operating speed as compared with the conventional memory array using buried bit lines.

Moreover, since the non-volatile memory of this memory does not use buried bit lines and buried source lines, the sources/drains can be formed after the word lines are formed, and the manufacturing process is more compatible with conventional CMOS processes.

Furthermore, with the isolation structures between columns of memory cells and the spacers on the sidewalls of the gates of the memory cells, the contacts between the sources/drains and source/drain lines can be formed as borderless contacts.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. An operating method of a non-volatile memory, the operating method being suitable for use on the non-volatile memory having:
   a plurality of memory cells an a p-well, a plurality of word lines, a plurality of drain lines and a plurality of source lines, wherein
   two adjacent memory cells in a column constitute a cell pair, and all cell pairs are arranged in rows and columns;
   two memory cells in each cell pair share a source region, and two adjacent cell pairs in a column share a drain region;
   the source regions in the same row are coupled to a source line;
   the gates of the memory cells in the same row are coupled to a word line; and
   the drain regions of the memory cells in the same column are coupled to a drain line,
   the operating method comprising:
   during an erasing operation of a selected memory cell, applying a first positive voltage to the word line coupled to the selected memory cell, and applying 0V to the p-well, the drain line and the source line coupled to the selected memory cell, wherein the first positive voltage is sufficiently high to induce channel Fowler-Nordheim tunneling phenomenon for erasing the selected memory cell; and
   during a programming operation of the selected memory cell, applying a first negative voltage to the word line coupled to the selected memory cell, applying a second positive voltage to the source line coupled to the selected memory cell, applying 0V to the drain line coupled to the selected memory cell, and applying a third positive voltage lower than the second positive voltage to the drain lines coupled to unselected memory cells, wherein a difference between the first negative voltage and the second positive voltage is sufficiently large to induce band-to-band hot hole injection phenomenon for programming the source side of the selected memory cell.

2. The operating method of claim 1, wherein the first positive voltage is about 10V~18V.

3. The operating method of claim 1, wherein the first negative voltage is about −1V~5V.

4. The operating method of claim 1, wherein the second positive voltage is about 3V~7V.

5. An operating method of a non-volatile memory, the operating method being suitable for use on the non-volatile memory having:
   a plurality of memory cells on a p-well, a plurality of word lines, a plurality of drain lines and a plurality of source lines, wherein
   two adjacent memory cells in a column constitute a cell pair, and all cell pairs are arranged in rows and columns;
   two memory cells in each cell pair share a source region, and two adjacent cell pairs in a column share a drain region;
   the source regions in the same row are coupled to a source line;
   the gates of the memory cells in the same row are coupled to a word line; and
   the drain regions of the memory cells in the same column are coupled to a drain line,
   the operating method comprising:
   during an erasing operation of a selected memory cell, applying a first positive voltage to the word line coupled to the selected memory cell, and applying a first negative voltage to the p-well, the drain line and the source line coupled to the selected memory cell, wherein a difference between the first positive voltage and the first negative voltage is sufficiently large to induce channel Fowler-Nordheim tunneling phenomenon for erasing the selected memory cell; and
   during a programming operation of the selected memory cell, applying a second negative voltage to the word line coupled to the selected memory cell, applying a second positive voltage to the source line coupled to the selected memory cell, applying 0V to the drain line coupled to the selected memory cell, and applying a third positive voltage lower than the second positive voltage to the drain lines coupled to unselected memory cells, wherein a difference between the second negative voltage and the second positive voltage is sufficiently large to induce band-to-band hot hole injection phenomenon for programming the source side of the selected memory cell.

6. The operating method of claim 5, wherein the first positive voltage is about 10V~18V.

7. The operating method of claim 5, wherein the first negative voltage is about 0V~−8V.

8. The operating method of claim 5, wherein the second negative voltage is about −1V~5V.

9. The operating method of claim 5, wherein the second positive voltage is about 3V~7V.

10. The operating method of claim 5, wherein the third positive voltage is about 2V~5V.

11. An operating method of a non-volatile memory, the operating method being suitable for use on the non-volatile memory having:

a plurality of memory cells on a p-well, a plurality of word lines, a plurality of drain lines and a plurality of source lines, wherein two adjacent memory cells in a column constitute a cell pair, and all cell pairs are arranged in rows and columns;

two memory cells in each cell pair share a source region, and two adjacent cell pairs in a column share a drain region;

the source regions in the same row are coupled to a source line;

the gates of the memory cells in the same row are coupled to a word line; and the drain regions of the memory cells in the same column are coupled to a drain line, the operating method comprising:

during an erasing operation of a selected memory cell, applying a first negative voltage to the word line coupled to the selected memory cell, applying a first positive voltage to the p-well, and floating (or applying the first positive voltage to) the drain line and the source line coupled to the selected memory cell, wherein a difference between the fist positive voltage and the first negative voltage is sufficiently large to induce Fowler-Nordheim tunneling phenomenon for erasing the selected memory cell; and during a programming operation of the selected memory cell, applying a second negative voltage to the word line coupled to the selected memory cell, applying a second positive voltage to the source line coupled to the selected memory cell, applying 0V to the drain line coupled to the selected memory cell, and applying a third positive voltage lower than the second positive voltage to the drain lines coupled to unselected memory cells, wherein a difference between the second negative voltage and the second positive voltage is sufficiently large to induce band-to-band hot hole injection phenomenon for programming the source side of the selected memory cell.

12. The operating method of claim 11, wherein the first negative voltage is about −10V~18V.

13. The operating method of claim 11, wherein the first positive voltage is about 0V~8V.

14. The operating method of claim 11, wherein the second negative voltage is about −1V~5V.

15. The operating method of claim 11, wherein the second positive voltage is about 3V~7V.

16. The operating method of claim 11, wherein the third positive voltage is about 2V~5V.

* * * * *